(12) United States Patent
Daanen et al.

(10) Patent No.: US 6,307,749 B1
(45) Date of Patent: Oct. 23, 2001

(54) OVERMOLDED ELECTRONIC MODULE WITH UNDERFILLED SURFACE-MOUNT COMPONENTS

(75) Inventors: Jeffery Ralph Daanen; Scott David Brandenburg, both of Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/692,866

(22) Filed: Oct. 23, 2000

(51) Int. Cl.[7] ...................................................... H05K 7/20
(52) U.S. Cl. ........................... 361/704; 361/707; 361/715; 361/719; 361/728; 257/687; 174/50.5; 174/50.51; 174/50.52; 174/50.53
(58) Field of Search ..................................... 361/704, 707, 361/709, 712, 713, 714, 715, 718–720, 728; 174/16.3, 50, 50.5, 50.51, 50.52, 50.53, 50.54, 50.56; 165/80.2; 257/687, 796

(56) References Cited

U.S. PATENT DOCUMENTS

| | | | |
|---|---|---|---|
| 5,311,060 | * | 5/1994 | Rostoker et al. ..................... 257/796 |
| 5,887,435 | * | 3/1999 | Morton ..................................... 62/3.6 |
| 5,898,224 | * | 4/1999 | Akram .................................... 257/778 |
| 5,901,044 | * | 5/1999 | Marro ..................................... 361/728 |
| 6,054,337 | * | 4/2000 | Solberg ................................. 438/107 |
| 6,180,045 | | 1/2001 | Brandenburg et al. . |

* cited by examiner

Primary Examiner—Leo P. Picard
Assistant Examiner—Boris L. Chervinsky
(74) Attorney, Agent, or Firm—Jimmy L. Funke

(57) ABSTRACT

An overmolded electronic module and a method for forming the module. The method entails both overmolding a circuit board and underfilling one or more surface-mount circuit devices physically and electrically connected to the board with solder bump connections. The circuit board is supported on a heatsink that thermally contacts a surface of the device opposite the circuit board. The board is optionally then encased on the heatsink with a retainer that includes means for biasing the circuit device against the heatsink. Finally, the circuit board is overmolded with a polymeric material to form an overmolded body that encases the circuit board and the circuit device with the heatsink. The overmold process is carried out so that a portion of the overmolded body completely underfills the circuit device and encapsulates its solder bump connections.

20 Claims, 2 Drawing Sheets

OVERMOLDED ELECTRONIC MODULE WITH UNDERFILLED SURFACE-MOUNT COMPONENTS

TECHNICAL FIELD

The present invention generally relates to overmolded electronic modules that include circuit boards with surface-mount (SM) devices. More particularly, this invention relates to an overmolded electronic module in which a circuit board is not only protectively encased within an overmold material, but in which the surface-mount devices are underfilled with the overmold material.

BACKGROUND OF THE INVENTION

Circuit boards with semiconductor devices such as flip chips must often be protected from the environment in which the board is employed. One widely-practiced approach is to enclose a circuit board in an assembly composed of a pair of case halves that are secured together with fasteners to form an enclosure that supports and protects the circuit board within. Connectors attached to one of the case halves provide for electrical interconnection to the circuit board. The assembly typically includes a sealing material between the case halves to exclude moisture from the enclosure. The resulting package must then be tested for leakage to ensure the package was properly assembled and sealed.

Because the above-described assembly process is labor intensive, less complicated assembly processes are highly desirable. One solution is an overmolded assembly disclosed in U.S. patent application Ser. No. 09/081,498. The assembly includes a circuit board, a heatsink with pedestals that thermally contact one or more circuit components mounted to the circuit board, and an optional retainer that biases the components into contact with the heatsink pedestals. An overmolded body encases the circuit board and retainer such that, with the heatsink, the overmolded body forms a moisture-impermeable seal around the circuit board and its circuit components. The circuit board, heatsink and retainer define cavities into which the overmold material, such as a thermosetting epoxy, flows during molding to encase the circuit board.

While the above-noted overmolded electronic assembly provides an uncomplicated method for encasing a circuit board and its circuit devices in a protective enclosure, it does not provide or allow for simultaneously underfilling surface-mount devices, such as flip chips and ball grid array (BGA) packages that are physically and electrically connected to the board with numerous solder bump connections. Underfilling is well known for promoting the reliability of flip chips and BGAs on organic circuit boards, and entails completely filling the void between the component and the circuit board with a specially formulated underfill material, such as a thermosetting epoxy. The underfill process has conventionally entailed placement of the underfill material along the perimeter of the component so that capillary action draws the material beneath the component and completely encapsulates the solder bump connections. For optimum reliability, underfill process parameters must be carefully controlled so that voids are not present in the underfill material beneath the component, and to ensure that a uniform fillet is formed along the entire perimeter of the component.

Because of the above process demands, different materials have been employed to underfill surface-mount components and overmold circuit boards. For example, overmolded assemblies in accordance with U.S. patent application Ser. No. 09/081,498 have been manufactured with surface-mount components underfilled with a specially formulated underfill material, after which the circuit board is overmolded with a second and different material specially formulated for this purpose. Another restriction has been the conventional wisdom that, for reliability, the underfill material must not contact the backside of the die or flow between the die and any surface contacting its backside.

SUMMARY OF THE INVENTION

According to the present invention, there is provided an overmolded electronic module and a method for forming the module. The method entails both overmolding a circuit board and underfilling one or more surface-mount circuit devices physically and electrically connected to the board with solder bump connections. The circuit board is supported on a heatsink that thermally contacts a surface of the device opposite the circuit board. The board may be enclosed on the heatsink with a retainer that includes means for biasing the circuit device against the heatsink. Finally, the circuit board is overmolded with a polymeric material to form an overmolded body that encases the circuit board and the circuit device with the heatsink. The overmold process is carried out so that the polymeric material completely underfills the circuit device and encapsulates its solder bump connections.

From the above, it can be seen that the present invention uses a single material to both overmold the circuit board and underfill its circuit devices. Therefore, the present invention is contrary to the conventional practice of using different materials to underfill a surface-mount device and overmold a circuit board, and is also contrary to the conventional wisdom that, for reliability, the material used to underfill a surface-mount device should not contact the backside of the device. An unexpected benefit of this invention is that the use of a single material having appropriate material properties, such as coefficient of thermal expansion (CTE) and shrinkage characteristics, to both overmold a circuit board and underfill its surface-mount circuit devices results in the circuit devices being in compression, such that the devices are mechanically locked to the board within the polymeric material and therefore less likely to experience solder joint failure.

In addition to the above, the present invention avoids the conventional practice of using individual case assemblies, fasteners and seals to form an electronic module. The electronic module of this invention can be manufactured on a completely automated final assembly line in which there is no assembly of seals to case halves and no fastening of case halves, and as a result no leak test requirement and reduced inventory of parts. Finally, the electronic module can exhibit improved heat transfer from the circuit devices, resistance to vibration and shock, and improved reliability due to the ability to more closely match the CTEs of the overmolding and circuit board materials.

Other objects and advantages of this invention will be better appreciated from the following detailed description.

DESCRIPTION OF THE PREFERRED EMBODIMENT

Figure 1:
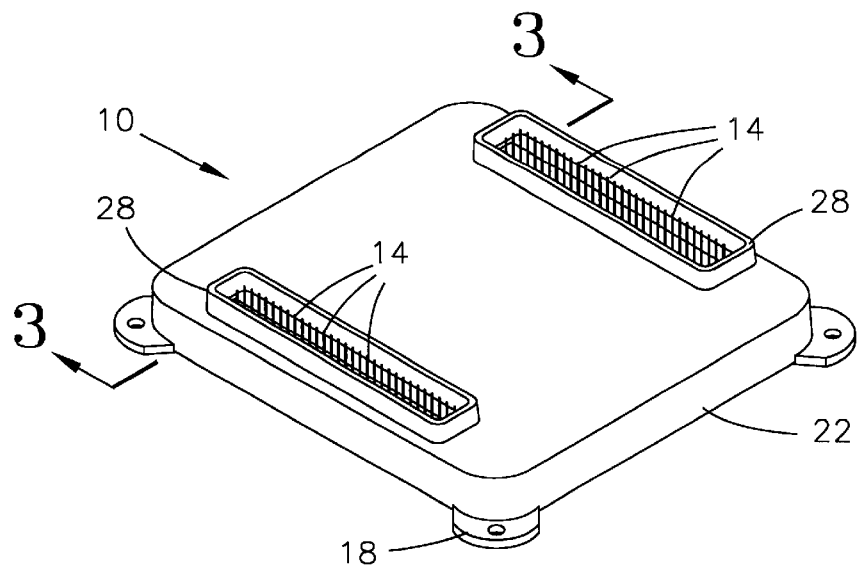
FIG. 1 shows an overmolded electronic module in accordance with a preferred embodiment of this invention.
Figure 2:
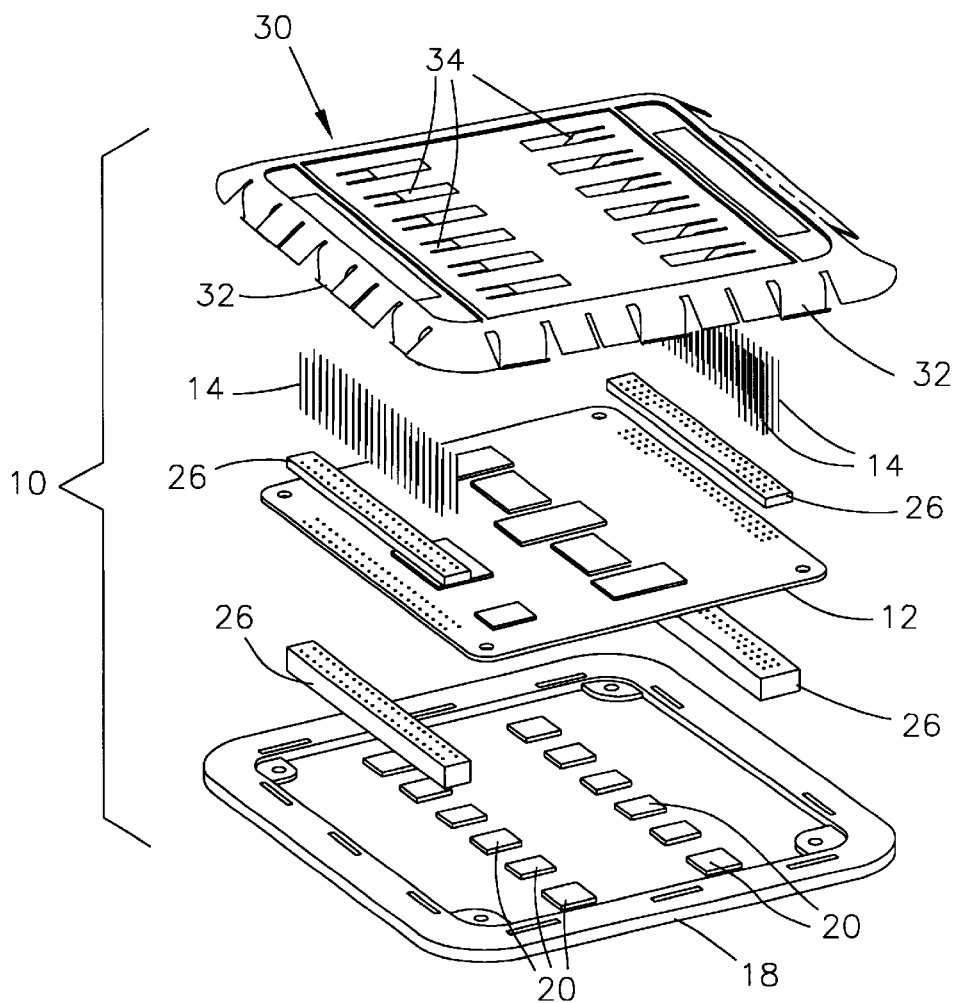
FIG. 2 is an exploded view of the overmolded electronic module of FIG. 1.
Figure 3:
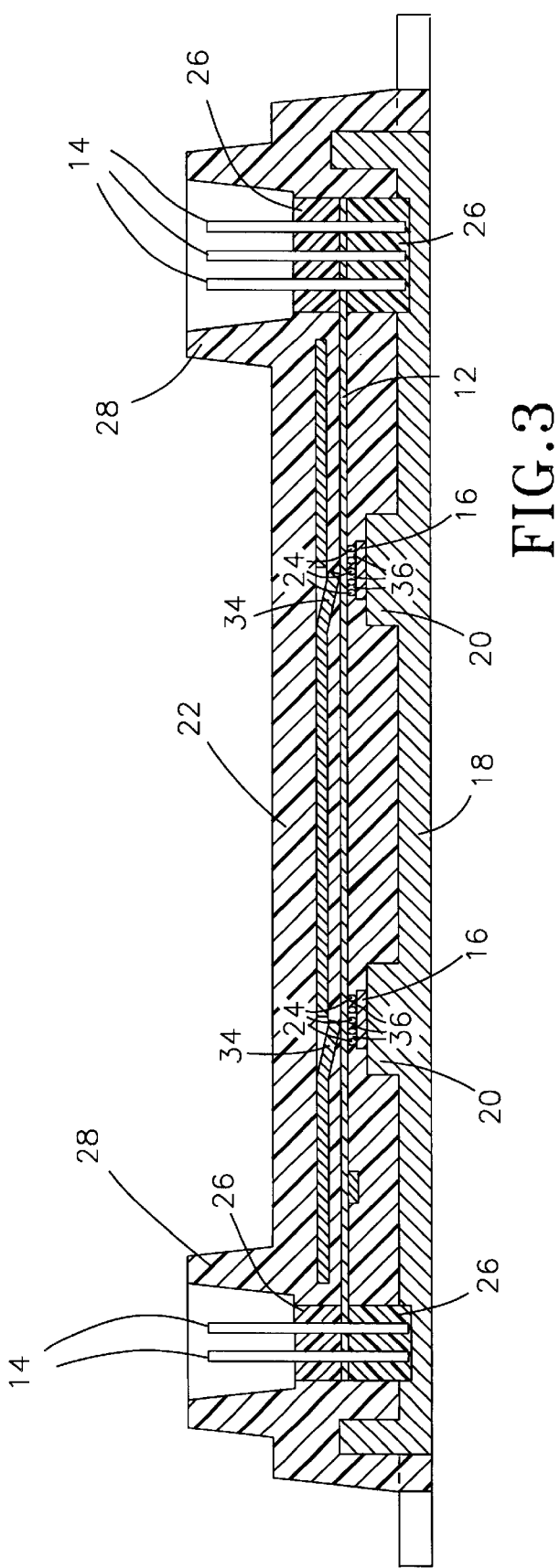
FIG. 3 is a cross-sectional view of the overmolded electronic module of FIG. 1.
Figure 4:
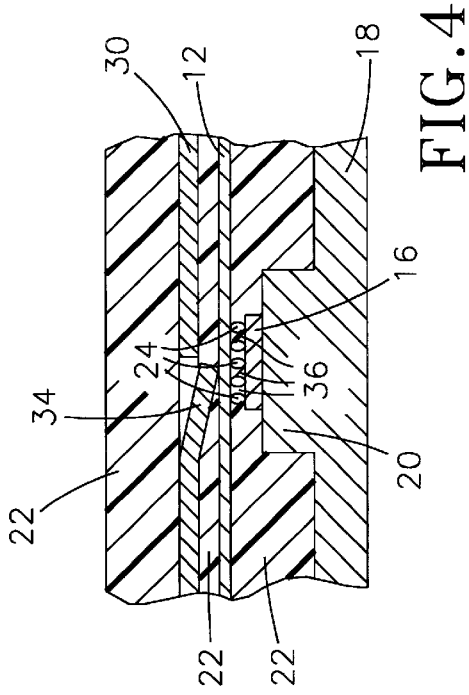

FIGS. 1 through 3 show an overmolded electronic module 10 enclosing a circuit board 12 in accordance with a preferred embodiment of this invention. The circuit board 12 may be a thin laminate, printed wiring board (PWB), or any other suitable circuit board material known in the art. Shown mounted to one surface of the circuit board 12 in FIG. 3 are several surface-mount IC packages 16 that dissipate heat. The packages 16 are represented as flip chips, though the invention is applicable to essentially any surface-mount device, including BGAs. As often done with surface-mount devices, the packages 16 are shown as being physically and electrically connected to the board 12 with solder connections 24, typically formed by reflowing solder bumps originally formed on the packages 16. The circuit board 12 includes I/O (input/output) connector pins 14 electrically interconnected with the IC packages 16 via the solder connections 24 and conductors (not shown) on the board 12.

In addition to the circuit board 12, the assembly 10 includes a heatsink 18 and a snap-fit retainer 30. The heatsink 18 is formed of a thermally conductive material, such as a metal or a metal-filled plastic, and has a number of pedestals 20 in thermal contact with the IC packages 16. As such, heat is conducted from the packages 16 and into the heatsink 18 for subsequent dissipation to the surrounding environment. The retainer 30 is an optional component of the assembly 10, and preferably formed from a metal or other electrically-conductive material, such that it is able to provide EMI shielding of the IC packages. As shown in FIGS. 2 and 3, the retainer 30 includes integrally-formed locking appendages 32 that interlock with the heatsink 18, and biasing members 34 that apply pressure to the near surface of the circuit board 12 to promote thermal contact between the IC packages 16 and the pedestals 20 on the heatsink 18. The locking appendages 32 and biasing members 34 can be any suitable elements, such as the resilient cantilevered springs shown in FIGS. 2 and 3. Locking appendages 32 and biasing members 34 of the type represented can be readily formed when the retainer 30 is fabricated by stamping. However, it is foreseeable that other elements could be used for these purposes, such as elastomeric pads located on the lower surface of the retainer 30 to contact the circuit board 12, or a thermally-conductive adhesive that bonds the packages 16 to the heatsink 18.

Finally, an overmolded housing 22 encases the circuit board 12, heat sink 18 and optionally the retainer 30, filling a cavity between the retainer 30 and the upper surface of the circuit board 12 (opposite the IC packages 16), and a cavity between the heatsink 18 and the lower surface of the board 12. In this manner, the overmolded housing 22 forms a moisture-impermeable seal around the circuit board 12 and its IC packages 16. The overmolded housing 22 is also shown in the Figures as including a pair of integrally-formed connector housings 28 into which the pins 14 project, such that the pins 14 and connector housings 28 form a pair of connectors on the exterior of the electronic module 10.

An important feature of the overmolded housing 22 is that the housing 22 not only fills the cavities on either side of the board 12, but also completely fills the gaps between the packages 16 and the board 12 created as a result of the solder connections 24 spacing the packages 16 above the surface of the board 12. As a result, the portions 36 of the housing 22 between the board 12 and its packages 16 is effectively an underfill material. To perform this dual role, the material used to form the housing 22 must readily flow during the overmolding/underfilling operation, and after curing have a suitable CTE relative to that of the board 12. Appropriate materials are thermosetting polymers such as epoxies to which a fine particulate fill material is added to achieve a CTE of about 12 to 17 ppm/° C. The fill material preferably has an average particle size of less than 1.0 mil (25 micrometers) to be sufficiently flowable during molding. Suitable compositions for the fill material are dependent on the particular thermosetting polymer used and the amount necessary to achieve the desired CTE. Particularly suitable overmold/underfill materials for the overmold housing 22 are thermoset epoxy resins to which about 80 to about 90 volume percent of silicon particles is admixed as a fill material.

To produce the electronic module 10 shown in the Figures, the circuit board 12 is preferably preassembled with the pins 14 and dielectric pin retainers 26, with a pair of the retainers 26 being positioned on each side of the circuit board 12. With the configuration shown, the pins 14 extend through the retainers 26 on the upper surface of the circuit board 12, through the circuit board 12, and into the retainers 26 on the lower surface of the circuit board 12, such that the pins 14 project above the upper pair of retainers 26 as shown. The circuit board 12 is then placed on the heatsink 18 such that the heatsink 18, and particularly the pedestals 20, thermally contact the IC packages 16. The lower pin retainers 26 support and space the circuit board 12 above the heatsink 18. The retainer 30 is then mounted to the subassembly formed by the circuit board 12 and heatsink 18, so that the circuit board 12 is encased by the retainer 30 and the heatsink 18.

The overmolded housing 22 is then molded in-situ by placing within a suitable mold cavity the subassembly formed by the circuit board 12, heatsink 18 and retainer 30. During molding, the polymeric material for the housing 22 flows over and around the circuit board 12, heatsink 18 and retainer 30 to completely encase the board 12 and underfill the packages 16. In this manner, the circuit board 12, the heatsink 18, pin retainers 26 and retainer 30 are insert-molded within the tooling in which the housing 22 is formed. The retainer 30 can be used to support the mold tooling during the molding operation.

During an investigation leading to this invention, forty modules similar to that shown in the Figures were produced in accordance with this invention. The circuit boards were 117×117 mm FR-4 printed wiring boards (PWBs), to which flip chips, BGA packages and various other surface-mount components were reflow soldered in accordance with conventional practice. The solder bump materials used were SnPb and SnAgCu solder alloys, and formed solder connections that spaced the packages about 90 micrometers above the board surface. The heatsinks were formed of either aluminum or copper, and included pedestals that contacted some of the packages. Several flip chips on each board were bonded to their respective pedestals with a thermally-conductive adhesive. Retainers 30 were not used in the investigation. The overmold/underfill material was a thermoset epoxy resin available from Shin-Etzu under the name Aratronic 211-AA, modified by the addition of about 80 to 90 volume percent of a silicon powder having an average particle size of less than 25 micrometers. Aratronic 211-AA was chosen as having particularly suitable properties, such as a low CTE (about 12 to 17 ppm/° C.), low viscosity and shrinkage, proper spiral flow characteristics, and the absence of a post-mold cure requirement. As a result of the molding operation, the overmold/underfill material completely filled the gaps between the packages and their respective boards.

All of the modules were then temperature cycled at one hour intervals between about −40° C. and 150° C., without any wear-out failures occurring after 3000 cycles (3000 hours), evidencing that the overmolded and underfilled modules of this invention are reliable.

While our invention has been described in terms of a preferred embodiment, it is apparent that other forms could be adopted by one skilled in the art. Accordingly, the scope of our invention is to be limited only by the following claims.

What is claimed is:

1. An overmolded electronic module comprising:
   a circuit board having a first surface and an oppositely-disposed second surface;
   a surface-mount circuit device attached to the second surface of the circuit board with solder bump connections, the circuit device being spaced above the second surface of the circuit board by the solder bump connections so as to define a gap therebetween;
   a heatsink thermally contacting a surface of the circuit device oppositely-disposed from the circuit board; and
   an overmolded body formed of an overmold material that encases the circuit board and the circuit device with the heatsink to provide a moisture-impermeable seal around the circuit board and the circuit device, the overmolded body having an underfill portion that completely underfills the circuit device and encapsulates the solder bump connections.

2. An overmolded electronic module according to claim 1, wherein the heatsink comprises pedestals that contact the circuit device.

3. An overmolded electronic module according to claim 1, further comprising supports spacing the circuit board from the heatsink.

4. An overmolded electronic module according to claim 1, further comprising:
   a connector housing integrally formed in an external surface of the overmolded body; and
   input/output pins that extend through the overmolded body and into the connector housing of the overmolded body, the input/output pins providing for electrical connection to the circuit device.

5. An overmolded electronic module according to claim 4, further comprising dielectric supports that surround the input/output pins and space the circuit board from the heatsink.

6. An overmolded electronic module according to claim 5, wherein the overmolded body contacts and covers the first and second surfaces of the circuit board and encases the circuit board, the dielectric supports and the circuit device.

7. An overmolded electronic module according to claim 1, further comprising a retainer enclosing the circuit board with the heatsink, the retainer comprising means for biasing the circuit device against the heatsink.

8. An overmolded electronic module according to claim 1, wherein the overmold material is an epoxy having a CTE of about 12 to 17 ppm/° C. and containing about 80 to about 90 volume percent of a fill material having an average particle size of less than 25 micrometers.

9. An overmolded electronic module according to claim 1, wherein the circuit device is under a compressive load from the overmold material.

10. An overmolded electronic module comprising:
    a heatsink having at least one pedestal;
    a circuit board supported on the heatsink so that a first surface of the circuit board faces away from the heatsink and a second surface of the circuit board faces the heatsink;
    a surface-mount circuit device attached to the second surface of the circuit board with solder bump connections at a first surface thereof, the circuit device being spaced above the second surface of the circuit board by the solder bump connections so as to define a gap therebetween;
    a metal snap-fit retainer mechanically locked to the heatsink so as to enclose the circuit board with the heatsink, the retainer contacting the circuit board so as to bias the circuit device against the heatsink;
    an overmolded body encasing the circuit board and the circuit device with the heatsink to provide a moisture-impermeable seal around the circuit board and the circuit device, the overmolded body having an underfill portion that completely fills the gap between the circuit device and the circuit board so as to underfill the circuit device and encapsulate the solder bump connections, the overmolded body applying a compressive load to the circuit device; and
    a connector housing integrally formed in an external surface of the overmolded body, the connector housing comprising input/output pins that extend through the overmolded body and provide electrical connection to the circuit device.

11. An overmolded electronic module according to claim 10, wherein the overmold material is an epoxy having a CTE of about 12 to 17 ppm/° C. and containing about 80 to about 90 volume percent of a fill material having an average particle size of less than 25 micrometers.

12. A method of assembling an overmolded electronic module, the method comprising the steps of:
    providing a circuit board having a first surface, an oppositely-disposed second surface, and a surface-mount circuit device attached to the second surface of the circuit board with solder bump connections, the circuit device being spaced above the second surface of the circuit board by the solder bump connections so as to define a gap therebetween;
    supporting the circuit board on a heatsink that thermally contacting a surface of the circuit device oppositely-disposed from the circuit board; and
    overmolding the circuit board with an overmold material so as to form an overmolded body that encases the circuit board and the circuit device with the heatsink to provide a moisture-impermeable seal around the circuit board and the circuit device, the overmolded body having an underfill portion that completely underfills the circuit device and encapsulates the solder bump connections.

13. A method according to claim 12, further comprising the step of forming the heatsink to have pedestals that contact the circuit device as a result of the supporting step.

14. A method according to claim 12, further comprising the step of placing first supports between the circuit board and the heatsink to space the circuit board from the heatsink following the supporting step.

15. A method according to claim 12, further comprising the steps of:
    equipping the circuit board with input/output pins that provide electrical connection to the circuit device; and
    integrally forming a connector housing in an external surface of the overmolded body during the overmolding step, the input-output pins extending through the overmolded body and into the connector housing of the overmolded body as a result of the overmolding step.

16. A method according to claim 15, further comprising the step of surrounding the input/output pins with dielectric supports between the circuit board and the heatsink, the dielectric supports spacing the circuit board from the heatsink following the supporting step.

17. A method according to claim 12, further comprising the steps of:

enclosing the circuit board with the heatsink and a retainer comprising means for biasing the circuit device against the heatsink; and mechanically locking the retainer to the heatsink with an integrally-formed resilient appendage of the retainer.

18. A method according to claim 17, further comprising the step of forming the biasing means as an integrally-formed resilient appendage of the retainer.

19. A method according to claim 12, wherein the overmold material is an epoxy having a CTE of about 12 to 17 ppm/° C. and containing about 80 to about 90 volume percent of a fill material having an average particle size of less than 25 micrometers.

20. A method according to claim 12, wherein the circuit device is under a compressive load from the overmold material.

* * * * *